US008379041B2

(12) United States Patent
Chen et al.

(10) Patent No.: US 8,379,041 B2
(45) Date of Patent: Feb. 19, 2013

(54) METHOD FOR EXTENDING DURATION OF A DISPLAY APPARATUS HAVING BRIGHTNESS COMPENSATION AND APPARATUS REALIZING THE SAME

(75) Inventors: Tzong-Kwei Chen, Hsinchu County (TW); Chun-Lin Shen, Hsinchu (TW); Yi-Chen Liu, Taichung (TW); Chen-Ting Kuan, Hsinchu County (TW)

(73) Assignee: Holtek Semiconductor Inc., Hsinchu (TW)

( * ) Notice: Subject to any disclaimer, the term of this patent is extended or adjusted under 35 U.S.C. 154(b) by 604 days.

(21) Appl. No.: 12/639,764

(22) Filed: Dec. 16, 2009

(65) Prior Publication Data

US 2011/0074806 A1 Mar. 31, 2011

(30) Foreign Application Priority Data

Sep. 25, 2009 (TW) ................................ 98132441 A

(51) Int. Cl.

| | |
|---|---|
| ***G09G 5/30*** | (2006.01) |
| ***G09G 5/00*** | (2006.01) |
| ***G09G 5/02*** | (2006.01) |
| ***G06F 13/00*** | (2006.01) |
| ***G06F 12/02*** | (2006.01) |
| ***G06F 12/00*** | (2006.01) |
| ***G03F 3/08*** | (2006.01) |
| ***G05D 25/00*** | (2006.01) |
| ***G06K 9/40*** | (2006.01) |

(52) U.S. Cl. ........ 345/589; 345/600; 345/536; 345/544; 345/204; 345/77; 358/520; 358/524; 362/552; 382/274; 711/100; 711/153; 711/173

(58) Field of Classification Search .................. 345/581, 345/589, 600–601, 531, 536, 544, 548, 562, 345/568, 574, 204, 207, 690, 211, 214, 3.14, 345/27, 42, 45, 48, 76–77, 84, 87–89, 98, 345/100–101; 358/504, 509–510, 520, 523–524, 358/525; 362/29–30, 606, 611–612, 552, 362/559, 561; 382/254, 274, 305; 711/100–105, 711/147–149, 153, 155, 173

See application file for complete search history.

(56) References Cited

U.S. PATENT DOCUMENTS

| | | | | |
|---|---|---|---|---|
| 2005/0088370 | A1 * | 4/2005 | Shigeta et al. | 345/60 |
| 2007/0080905 | A1 * | 4/2007 | Takahara | 345/76 |
| 2007/0152934 | A1 * | 7/2007 | Maeda | 345/92 |
| 2009/0278867 | A1 * | 11/2009 | Brown Elliott et al. | 345/690 |

* cited by examiner

*Primary Examiner* — Wesner Sajous
(74) *Attorney, Agent, or Firm* — Morris Manning & Martin LLP; Tim Tingkang Xia, Esq.

(57) ABSTRACT

For improving the drawback of brightness decay of a display due to aging, a memory can be used to store the usage time of each pixel of the display, then based upon the usage time the brightness decay of each pixel of the display can be compensated and accordingly the value for the compensation can be stored in a volatile memory and a non-volatile memory. However, the usage of the non-volatile memory is limited. Hence, the present invention discloses a new approach for storing the data so as to decrease write-in sequence per unit area for the non-volatile memory rather than increasing its storing capacity proportionally.

22 Claims, 10 Drawing Sheets

METHOD FOR EXTENDING DURATION OF A DISPLAY APPARATUS HAVING BRIGHTNESS COMPENSATION AND APPARATUS REALIZING THE SAME

BACKGROUND OF THE INVENTION

1. Field of the Invention

The present invention relates to a method for extending duration of a display apparatus having brightness compensation and an apparatus realizing the same, more particularly to, a method for extending duration of a display apparatus having brightness compensation and an apparatus realizing the same by properly dividing a non-volatile memory of the apparatus.

2. Description of the Prior Arts

For conventional display devices, such as FED, after being used for a while, the display will be getting darken in view of their brightness (also known as luminance) due to aging, and, since each pixel of the devices corresponds to a different period of brightness for difference colors, the aging level will differ. Hence, in order to maintain the brightness and the even color, the brightness of each pixel needs to be compensated individually.

Refer to FIG. 1A, which provides a display system 10, comprising a brightness compensation apparatus 101 which cooperates with a driver integrated circuit 102 so as to drive a display means 103, said compensation apparatus 101 further comprises: a volatile memory 104, for storing a brightness accumulation for each pixel in view of different color on the display means 103; a non-volatile memory 105, for preventing the brightness accumulating from missing from the system 10 during its shutting down period; and a calculating means 106, for accumulating the brightness of each pixel; wherein, as illustrated in FIG. 1B, a write-in area of the non-volatile memory 105 is evenly divided into n equivalent areas, such as area 0 to area n−1.

The usage record for brightness accumulation usage will be first stored by the faster volatile memory 104, then being sequentially forwarded to the driver IC 102. Since once if the system shutting down, these usage record will turn disappeared, so periodically, the record must be also stored in the non-volatile memory 105 so as the record can be refreshed in volatile memory 104 while the system regains operating.

FIG. 1C further illustrates the algorithm disclosed in the prior art. Supposed the needed accumulated brightness data is bit 0*a*~bit 3*a*, and the data prior to accumulation is 31-bit data such as bit 0*b*~bit 30*b*, then the data after accumulation is 31-bit data such as bit 0*c*~bit 30*c*, and for the 31-bit data after accumulation, conventionally, only part of the maximum effect bits such as bit 15*c*~bit 30*c* are stored in the non-volatile memory 105 so as to prevent data of said bit 0*b*~bit 30*b* for the aforesaid volatile memory 104 from disappearance, which is illustrated in FIG. 1D.

However, in view of the non-volatile memory 105, the write-in sequence per unit capacity is limited, as a result, the conventional approach is using a higher capacity of the memory 105 to trade more write-in sequence, for example, if an eight time of write sequence is desired, then eight equivalent-sized flash memories each being divided into n equivalent areas are used to serve the write-in process in turn, as illustrated in FIG. 1B. Correspondingly, the higher-capacity flash memory will increase the system cost. Accordingly, in view of the above drawbacks, it is an imperative that an apparatus and method are designed so as to use the minimum capacity but achieve the same write-in sequence and meanwhile optimize the flash memory usage or duration as the foregoing.

SUMMARY OF THE INVENTION

In view of the disadvantages of prior art, the primary object of the present invention is to optimize the usage of the non-volatile memory used in the prior art display apparatus by using the smallest capacity of the non-volatile memory but achieve the same write-in sequence.

According to one aspect of the present invention, one skilled in the art can provide a method Hence, the present invention relates to a long-duration display apparatus having brightness compensation, comprising: a volatile memory, for storing a brightness accumulation for each pixel in view of different color on the display apparatus; a non-volatile memory, for preventing the brightness accumulating from missing during its shutting down period; and a calculating means, for accumulating the brightness of each pixel; wherein, a write-in area of the non-volatile memory is divided into a first area and a plurality of second areas, and the first area has a bigger capacity than the second areas do.

The present invention further relates to a method for extending duration of a display apparatus having brightness compensation, comprising steps of:

- providing a volatile memory for storing an m-bit accumulation value for the brightness compensation and an n-bit non-volatile memory;
- selecting a p bit value as a virtual bit value;
- dividing the n-bit non-volatile memory into a h-bit high-bit memory and k2 low-bit memories, wherein each of the k2 memories is long as j+p bits;
- moving a part of the accumulation value for brightness compensation into the h-bit high-bit memory, where the part refers to data between MSB ($m^{th}$ bit of the accumulation value) and $(m-h+1)^{th}$ bit; and
- writing j-bit data (between $(m-h)^{th}$ bit~$(m-(h+j)+1)^{th}$ bit) of accumulation value for brightness compensation and the p-bit virtual bit into first one of the k2 low-bit memories, wherein, m, n, j, p, h, and k2 are integers greater than zero.

The present invention further relates to a method for extending duration of a display apparatus having brightness compensation, comprising steps of:

- providing a volatile memory for storing an m-bit accumulation value for the brightness compensation and an n-bit non-volatile memory;
- selecting a p bit value as a virtual bit value;
- dividing the n-bit non-volatile memory into a (h+j)-bit complete area memory and k1 low-bit memories, wherein each of the k1 memories is long as j+p bits;
- moving a part of the accumulation value for brightness compensation into the (h+j)-bit complete area, where the part refers to data between MSB ($m^{th}$ bit of the accumulation value) and $(m-(h+j)+1)^{th}$ bit; and
- writing j-bit data (between $(m-h)^{th}$ bit~$(m-(h+j)+1)^{th}$ bit) of partial accumulation value for brightness compensation and the p-bit virtual bit into first one of the k1 low-bit memories, wherein, m, n, j, p, h, and k1 are integers greater than zero.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become readily understood from the detailed description given herein below and the accompanying drawings which are given by way of illustration only, and thus are not limitative of the present invention and wherein.

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as the follows.

Figure 1A:
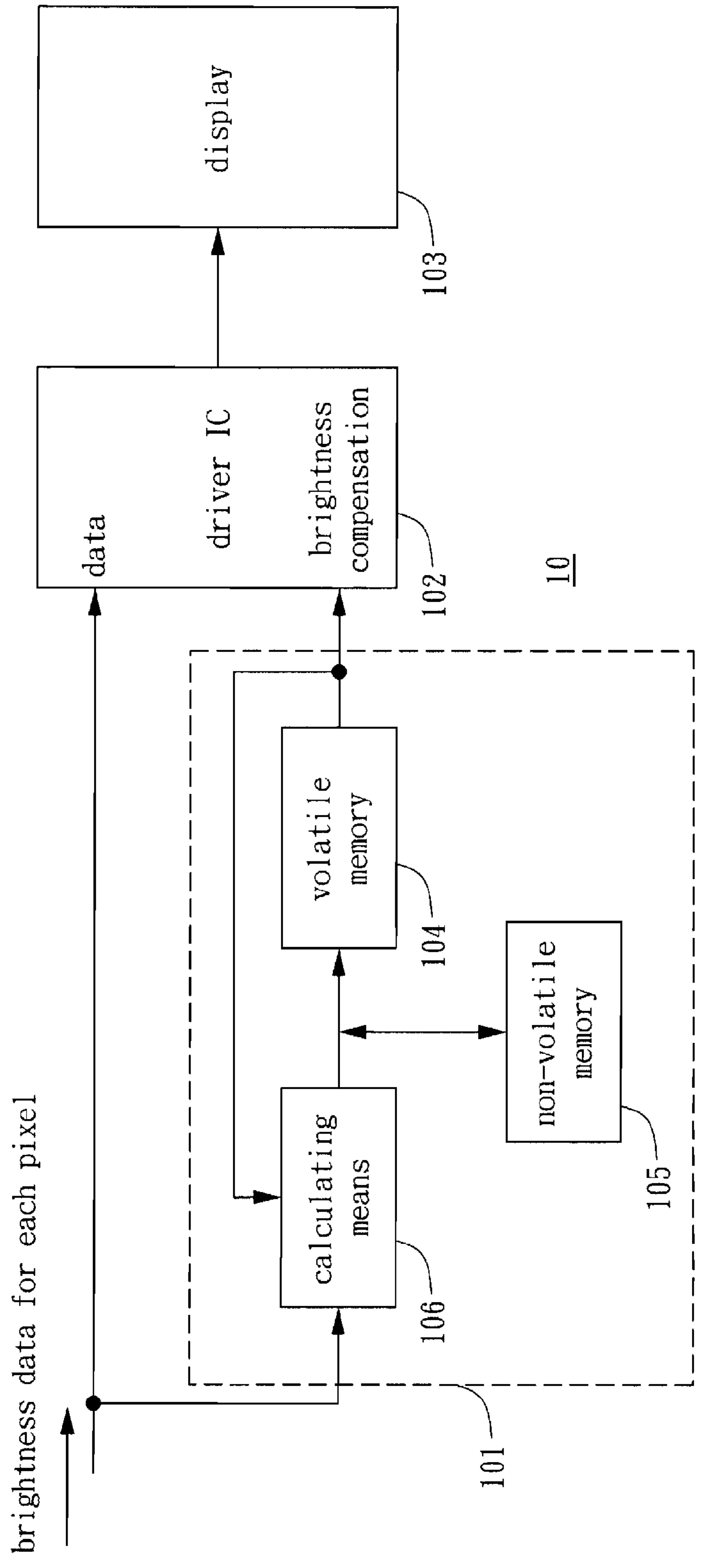
FIG. 1A (Prior Art)
FIG. 1A~D are a perspective view according to the prior art.
Figure 1B:
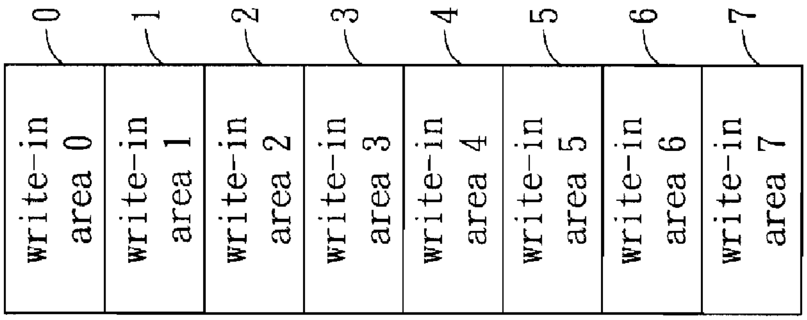
FIG. 1B (Prior Art)
Figure 1C:
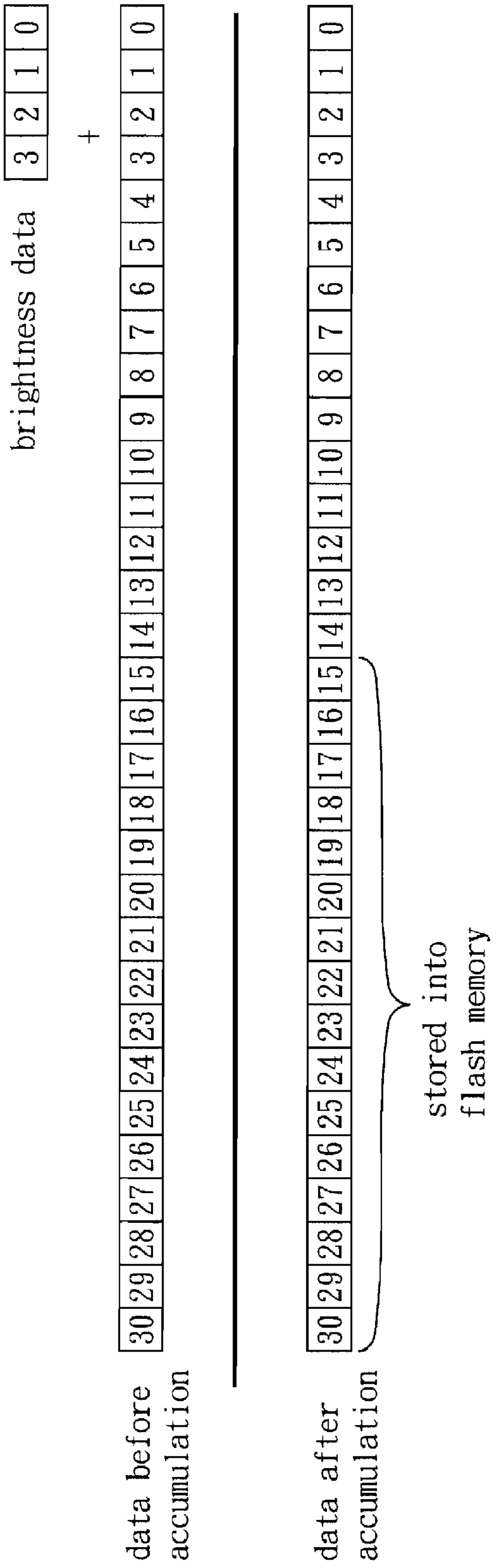
FIG. 1C (Prior Art)
Figure 1D:
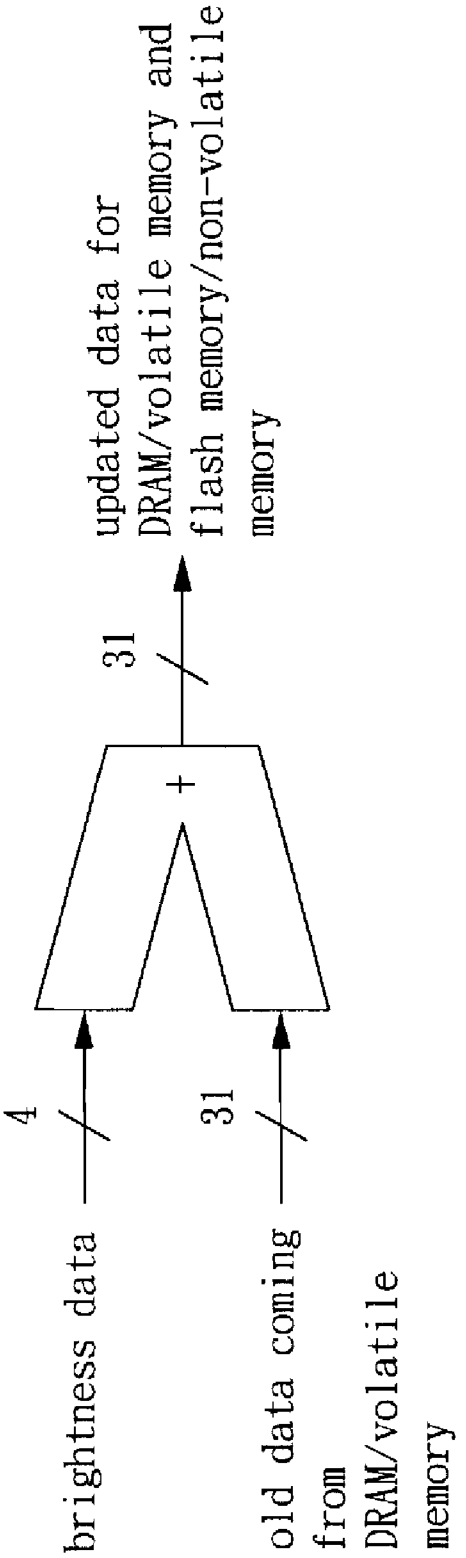
FIG. 1D (Prior Art)
Figure 1E:
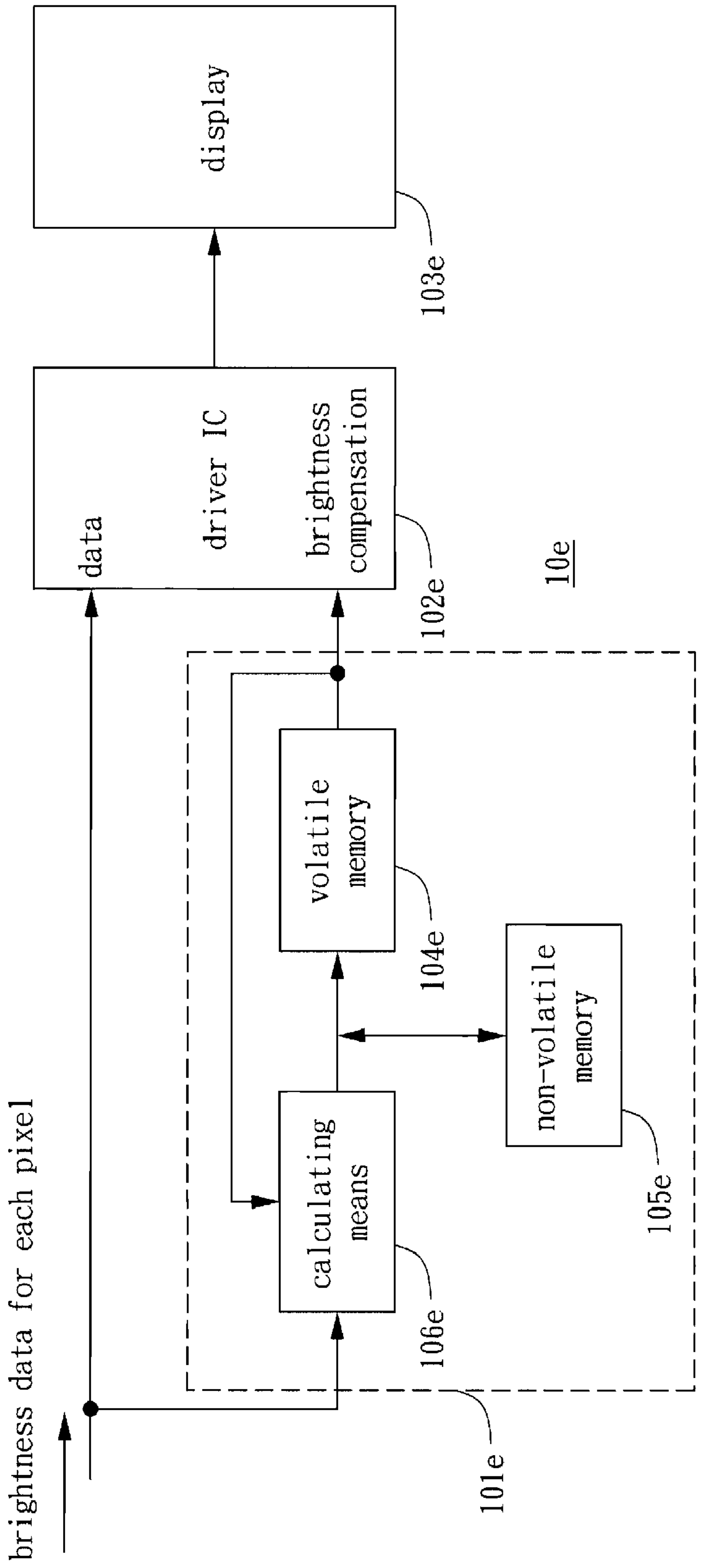
FIG. 1E relates to a schematic view of a preferred embodiment according to the present invention.

The present invention relates to a long-duration display apparatus having brightness compensation, as illustrated in FIG. 1E, comprises: a brightness compensation apparatus 101*e* which cooperates with a driver integrated circuit 102*e* so as to drive a display means 103*e*, said compensation apparatus 101*e* further comprises: a volatile memory 104*e*, for storing a brightness accumulation for each pixel in view of different color on the display means 103*e*; a non-volatile memory 105*e*, for preventing the brightness accumulating from missing from the system 10*e* during its shutting down period; and a calculating means 106*e*, for accumulating the brightness of each pixel;

The present invention is characterized in that, the carry for the higher bit in view of the brightness data accumulation of the volatile memory 104*e* takes some while, and the higher-bit data varies slower, and the lower-bit data varies faster. As a result, if the high/low bit data are respectively stored in different divided areas of the non-volatile memory 105*e*, which means, if the write-in sequences for high/low bit will not interfere each other, then the write-in usage/sequence can be reduced so as to increase the duration for non-volatile memory 105*e* or flash memory.

As usual, the write-in approach for either non-volatile memory 105*e* or flash memory is limited, for each time the whole area, (each area can be as sized as several thousand or more than ten thousand words) must be cleaned and then one data by one data process is processed. Hence, the write-in sequence for the divided high-bit area is desirable to be reduced but there is no knowing when a carry of the low bit will be advanced to high-bit area. To address this issue, there is inserted one or a plurality of "virtual bit(s)" between the high-bit area and the low-bit area as a buffer to register (temporarily store) a carry originally being advanced immediately from low-bit area to the high-bit area, and the carry is carried from the low-bit area to the high-bit area during a certain period.

Figure 2A:
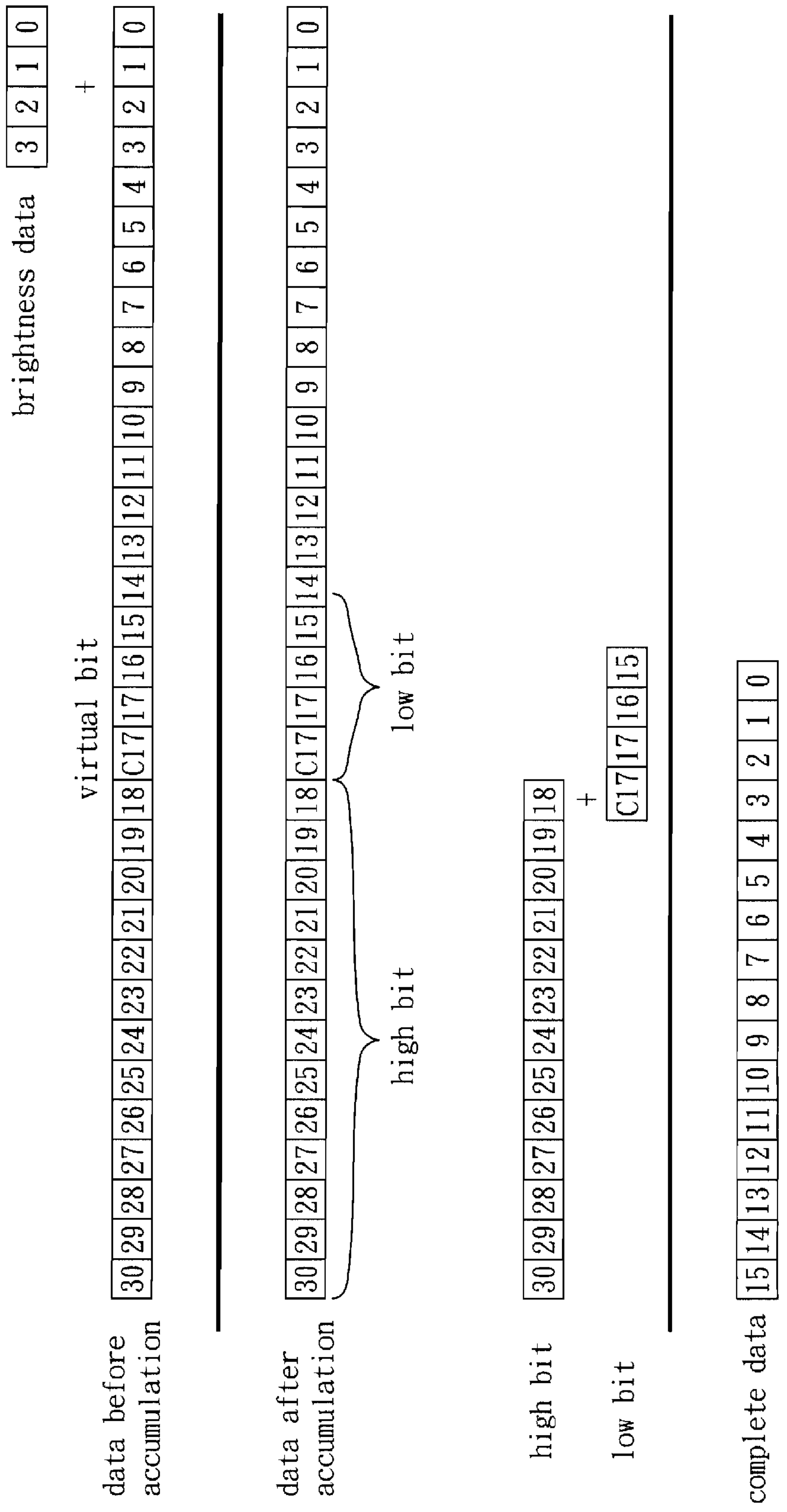
FIG. 2A relates to an algorithm of a preferred embodiment according to the present invention.

FIG. 2A illustrates an algorithm according to one of the prefer embodiments of the present invention. It is the different between the present embodiment and the prior art disclosed at FIG. 1C that, in the present embodiment, between the minimum effective bit 18 in the high-bit area and the maximum effective bit 17 of the lower-bit area, there is inserted into one or more than one virtual bit such as c17 to register a carry originally being advanced to the high-bit area, serving as buffering for a while and then join the high-bit area. The virtual bit c17 can be stored in a part of the volatile memory 104, or be stored in a register.

Figure 2B:
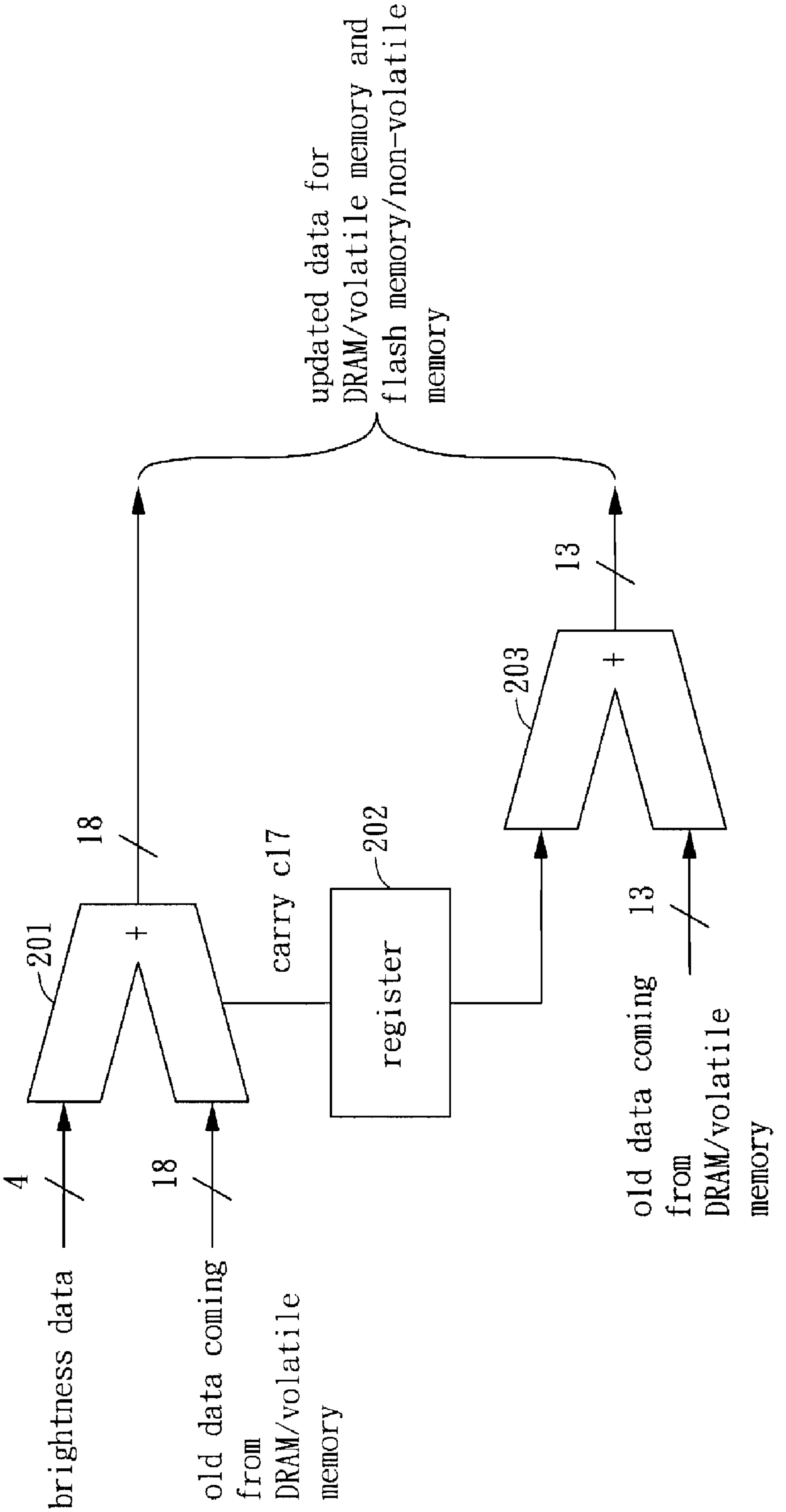
FIG. 2B relates to a schematic view of the preferred embodiment according to FIG. 2A.

FIG. 2B further illustrates an apparatus structure of the FIG. 2A in the present invention, which relates to a first adder 201, a second adder 203, and a register 202. The first adder 201 receives a four-bit brightness data and a bit 0~bit 17 old data from the volatile memory 104 and sums them together so as to forward the bit 0~bit 17 updated data again to said volatile memory 104, and the data of bit15~bit17 together the aforesaid virtual bit such as c17 to the low-bit area of the non-volatile memory 105. After summing them in the same manner for a plurality of times, should there be any carry appears, the carry is carried to the register 202. In the present embodiment, there are three bits as 0 from bit 15 to bit 17, hence, after a plurality of accumulating or summing, (here it refers $2^3$, namely, the $8^{th}$ time) again, the second adder 203 sums the data in the register 202 and bit 18 and then forward the result thereof (namely, the updated bit 18~bit 30) into a corresponding position in the non-volatile memory 105 and the volatile memory 104.

For each $8^{th}$ time, the "complete" data are stored in the complete area 300, and for the other $1^{st}$~$7^{th}$ time, only the low-bit data are stored in the low-bit area 1~7, in the manner, the write-in sequence can be increased as eight times at a cost of 1+7/4, namely, 2.75 times of memory capacity, since the low-bit area is only a quarter of the "complete" area. At the "read-out" action for the memory, a desired data can be accessed by, respectively reading out the data of bit 30~bit 18 and the latest bit 17~bit 15 of the low-bit area and the virtual bit, then assembling them together. If the latest bit 17~15 is stored in the complete area, then only the data in the complete area is accessed.

Figure 3:
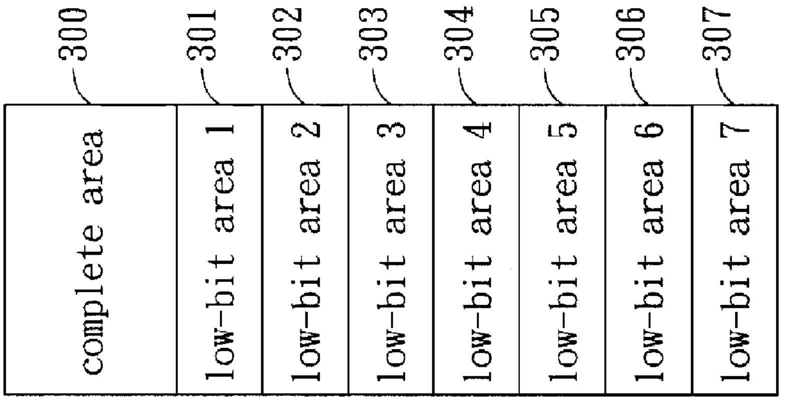
FIG. 3 relates to a dividing diagram of the non-volatile memory according to the present invention.
Figure 4:
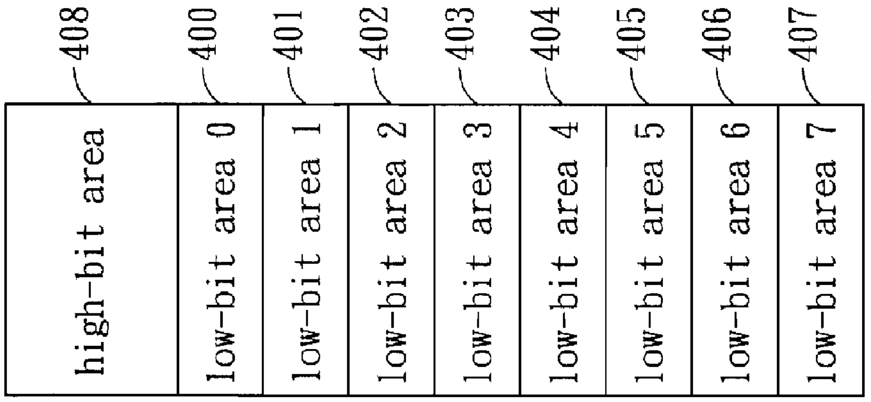
FIG. 4 relates to another dividing diagram of the non-volatile memory according to the present invention.

FIG. 4 relates to another one of the preferred embodiments according to the present invention. At this time, said non-volatile memory 105 is divided into a high-bit area 408 and a low-bit area 400~407, where said 408 and said 400~407 are completely separated, thus, there are totally eight low-bit areas. The write-in approach is similar to the disclosure of FIG. 3, for each $9^{th}$ time, the high-bit data are stored in a high-bit area 408, and for the other $1^{st}$~$8^{th}$ time, only the low-bit data are stored in the low-bit area 0~7. While the data desired by the display apparatus is read out, the high-bit data and the low-bit data are assembled.

The skilled artisan can also vary the division of the non-volatile memory depending on the actual demand for the high-bit area, low-bit area, and virtual bit(s) area.

Preferably, the volatile memory 104 is selected from a dynamic random access memory or a static random access memory.

Preferably, the non-volatile memory is a flash memory.

Figure 5:
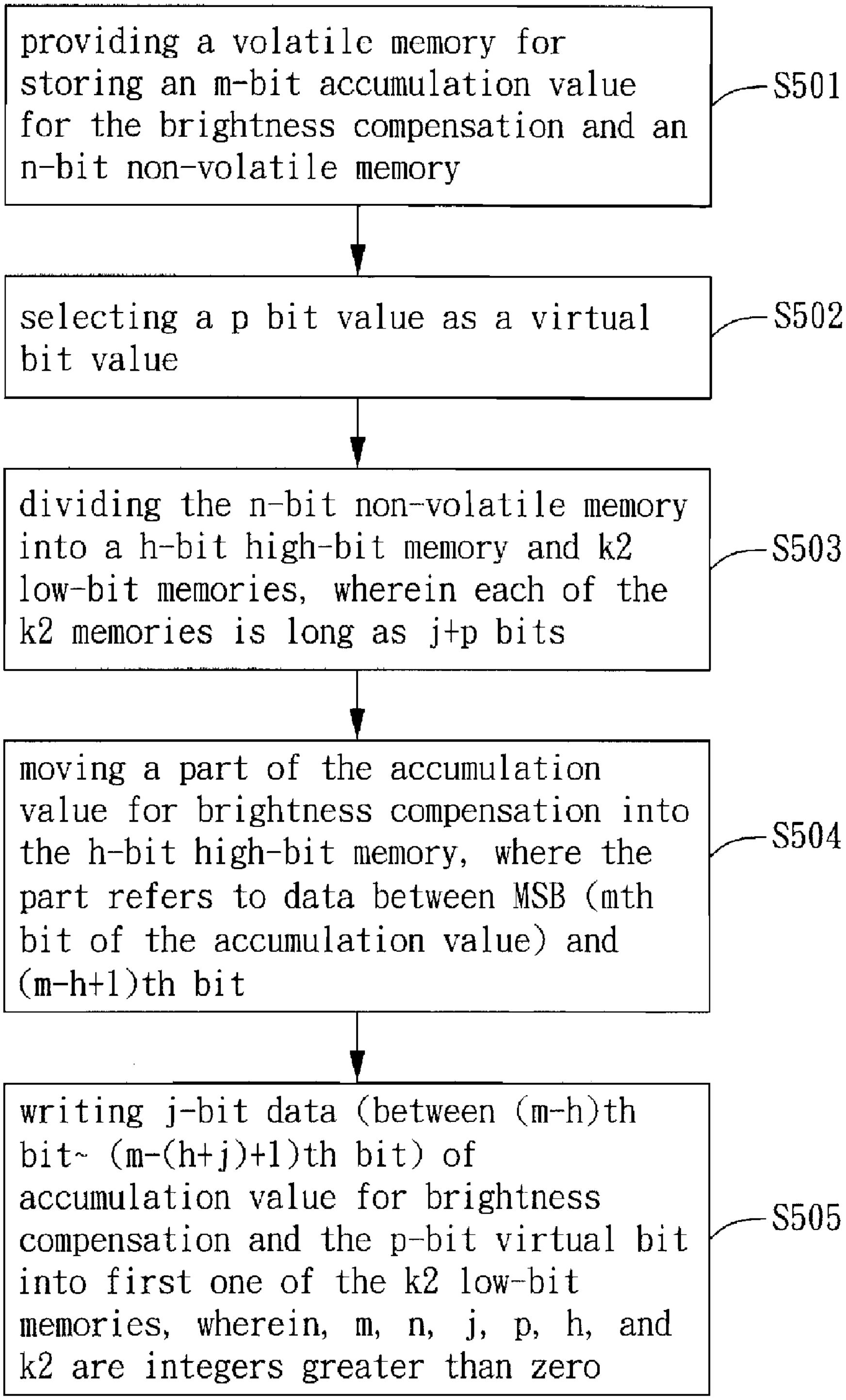
FIG. 5 relates to a method flow chart of the preferred embodiment according to the present invention.

FIG. 5 relates to another preferred embodiment according to the present invention, which illustrates a method for extending duration of a display apparatus having brightness compensation, comprising steps of: s501: providing a volatile memory for storing an m-bit accumulation value for the brightness compensation and an n-bit non-volatile memory; s502: selecting a p bit value as a virtual bit value; s503: dividing the n-bit non-volatile memory into a h-bit high-bit memory and k2 low-bit memories, wherein each of the k2 memories is long as j+p bits; s504: moving a part of the accumulation value for brightness compensation into the h-bit high-bit memory, where the part refers to data between MSB ($m^{th}$ bit of the accumulation value) and $(m-h+1)^{th}$ bit; and s505: writing j-bit data (between $(m-h)^{th}$ bit~$(m-(h+j)+1)^{th}$ bit) of accumulation value for brightness compensation and the p-bit virtual bit into first one of the k2 low-bit memories, wherein, m, n, j, p, h, and k2 are integers greater than zero.

Preferably, the method further comprises a step of: s506: whenever there is a change for the $(m-(h+j)+1)^{th}$ bit of accumulation value, sequentially writing $(m-h)^{th}$~$(m-(h+j)+1)^{th}$ data of the m-bit brightness accumulation and the p-bit virtual bit into second ~k2$^{th}$ ones of the k2 low-bit memories;

Preferably, the method further comprises a step of s507: after step 506, if there is again a change for the $(m-(h+j)+1)^{th}$ bit of the accumulation value, summing a LSB (least significant bit) data stored in the h-bit high-bit memory and the virtual bit p and writing the result thereof to the h-bit high-bit memory and then go back to s505;

Preferably, the method further comprises a step of s508: reading out data stored in the non-volatile memory by assembling the h-bit high-bit memory and the latest data stored in the low-bit memory.

Figure 6:
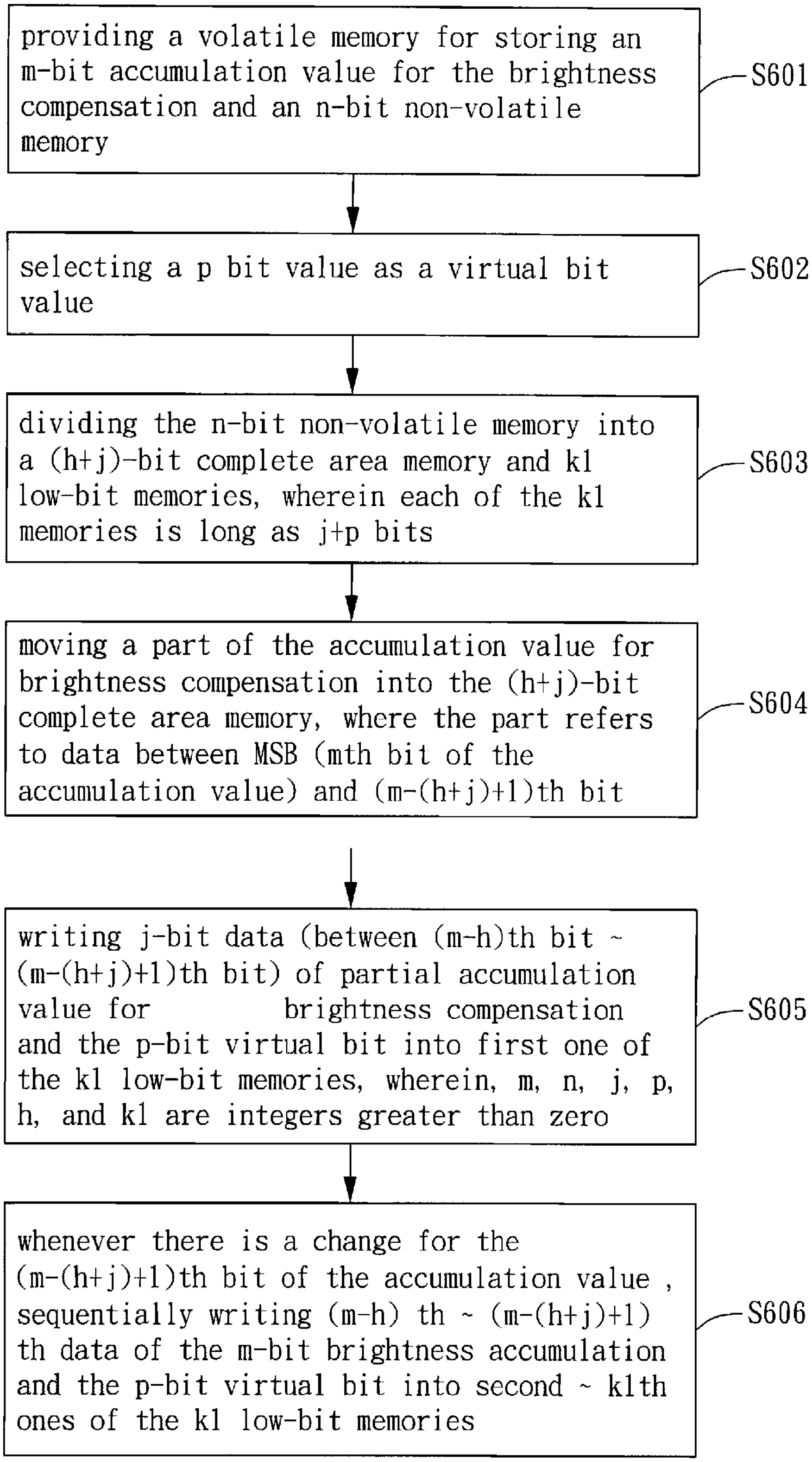
FIG. 6 relates to another method flow chart of the preferred embodiment according to the present invention.

FIG. 6 discloses another embodiment according to the present invention, which relates to a method for extending duration of a display apparatus having brightness compensation, comprising steps of: 601: providing a volatile memory for storing an m-bit accumulation value for the brightness compensation and an n-bit non-volatile memory; s602: selecting a p bit value as a virtual bit value; s603: dividing the n-bit non-volatile memory into a (h+j)-bit complete area and k1 low-bit memories, wherein each of the k1 memories is long as j+p bits; s604: moving a part of the accumulation value for brightness compensation into the (h+j)-bit complete area, where the part refers to data between MSB ($m^{th}$ bit of the accumulation value) and $(m-(h+j)+1)^{th}$ bit; and s605: writing j-bit data (between $(m-h)^{th}$ bit~$(m-(h+j)+1)^{th}$ bit) of partial accumulation value for brightness compensation and the p-bit virtual bit into first one of the k2 low-bit memories, wherein, m, n, j, p, h, and k1 are integers greater than zero.

Preferably, the method further comprises a step of: s606: whenever there is a change for the $(m-(h+j)+1)^{th}$ bit of the accumulation value, sequentially writing $(m-h)^{th}$~$(m-(h+j)+1)^{th}$ data of the m-bit brightness accumulation and the p-bit virtual bit into second ~k1$^{th}$ ones of the k1 low-bit memories.

Preferably, the method further comprises a step of: s607: after step 606, if there is again a change for the $(m-(h+j)+1)^{th}$ bit of the accumulation value, summing a $h^{th}$-bit data stored in the (h+j)-bit complete area and the virtual bit p and writing the result thereof to the (h+j)-bit complete area and then go back to s605.

The invention being thus aforesaid, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A method for extending duration of a display apparatus having brightness compensation, comprising steps of:

(a) providing a volatile memory for storing an m-bit accumulation value for the brightness compensation and an n-bit non-volatile memory;

(b) selecting a p bit value as a virtual bit value;

(c) dividing the n-bit non-volatile memory into a h-bit high-bit memory and a plurality of k1 low-bit memories, wherein each of the k1 memories is as long as j+p bits;

(d) moving a part of the accumulation value for brightness compensation into the h-bit high-bit memory, where the part refers to data between $m^{th}$ bit of the accumulation value and $(m-(h+j)+1)^{th}$ bit; and (e) writing j-bit data (between $(m-h)^{th}$ bit~$(m-(h+j)+1)^{th}$ bit) of accumulation value for brightness compensation and the p-bit virtual bit into first one of the k1 low-bit memories, wherein, m, n, j, p, h, and k1 are integers greater than zero.

2. The method as recited in claim 1, further comprising a step of:

(f) whenever there is a change for the $(m-(h+j)+1)^{th}$ bit of the high-bit memory, sequentially writing $(m-h)^{th}$~$(m-(h+j)+1)^{th}$ data of the m-bit brightness accumulation and the p-bit virtual bit into second ~k1$^{th}$ ones of the k1 low-bit memories.

3. The method as recited in claim 2, further comprising a step of:

(g) after step (f), if there is again a change for the $(m-(h+j)+1)^{th}$ bit of the accumulation value, summing a LSB data stored in the h-bit high-bit memory and the virtual bit p and writing the result thereof to the h-bit high-bit memory and then go back to step (e).

4. The method as recited in claim 3, further comprising a step of:

(h) reading out data stored in the non-volatile memory by assembling the h-bit high-bit memory and the latest data stored in the low-bit memory.

5. The method as recited in claim 1, wherein the virtual bit value is found in the volatile memory.

6. The method as recited in claim 1, wherein the volatile memory is selected from the group consisting of a DRAM or a SRAM.

7. The method as recited in claim 1, wherein the non-volatile memory is flash memory.

8. A method for extending duration of a display apparatus having brightness compensation, comprising steps of:

(a) providing a volatile memory for storing an m-bit accumulation value for the brightness compensation and an n-bit non-volatile memory;

(b) selecting a p bit value as a virtual bit value;

(c) dividing the n-bit non-volatile memory into a (h+j)-bit complete area and a plurality of k1 low-bit memories, wherein each of the k1 memories is as long as j+p bits;

(d) moving a part of the accumulation value for brightness compensation into the (h+j)-bit complete area, where the part refers to data between $m^{th}$ bit of the accumulation value and $(m-(h+1)+1)^{th}$ bit; and (e) writing j-bit data (between $(m-h)^{th}$ bit~$(m-(h+j)+1)^{th}$ bit) of partial accumulation value for brightness compensation and the p-bit virtual bit into first one of the k1 low-bit memories, wherein, m, n, j, p, h, and k1 are integers greater than zero.

9. The method as recited in claim 8, further comprising a step of:

(f) whenever there is a change for the $(m-(h+j)+1)^{th}$ bit of the accumulation value, sequentially writing $(m-h)^{th}$~

$(m-(h+j)+1)^{th}$ data of the m-bit brightness accumulation and the p-bit virtual bit into second ~$k1^{th}$ ones of the k1 low-bit memories.

10. The method as recited in claim 9, further comprising a step of:

(g) after (f), if there is again a change for the $(m-(h+j)+1)^{th}$ bit of the accumulation value, summing a $h^{th}$-bit data stored in the (h+j)-bit complete area and the virtual bit p, and writing its result thereof to the (h+j)-bit complete area and then go back to (e).

11. The method as recited in claim 8, wherein the virtual bit value is found in the volatile memory.

12. The method as recited in claim 8, wherein the volatile memory is selected from the group consisting of a DRAM or a SRAM.

13. The method as recited in claim 8, wherein the non-volatile memory is a flash memory.

14. A long-duration display apparatus having brightness compensation, comprising:

a volatile memory, for storing a brightness accumulation for each pixel in view of different color on the display apparatus;

a non-volatile memory, for preventing a brightness accumulating from missing during shutting down period of the long-duration display apparatus; and a calculating means, for accumulating the brightness of each pixel;

wherein, a write-in area of the non-volatile memory is divided into a first area and a plurality of second areas, the first area has a bigger capacity than the second areas do, and the second areas are used for storing low-bit data of the brightness accumulation.

15. The apparatus as recited in claim 14, wherein said volatile memory is selected from the group consisting of a DRAM and a SRAM.

16. The apparatus as recited in claim 14, wherein said non-volatile memory is a flash memory.

17. The apparatus as recited in claim 14, wherein said first area is used for storing complete data of the brightness accumulation or high-bit data of the brightness accumulation.

18. The apparatus as recited in claim 14, wherein the calculating means is accumulating the brightness accumulation by a two-section style according to a high-bit and low-bit part of the brightness accumulation.

19. The apparatus as recited in claim 14, wherein a low-bit of the brightness accumulation and its highest carry are respectively being stored in the second areas of the non-volatile memory by the calculating means, after a plurality of times, then highest carry is then being stored into a first area of the non-volatile memory.

20. The apparatus as recited in claim 14, wherein the calculating means further comprises a first adder.

21. The apparatus as recited in claim 20, wherein the calculating means further comprises a second adder.

22. The apparatus as recited in claim 21, wherein the calculating means further comprises a register.

* * * * *